(12) United States Patent
Kobayashi et al.

(10) Patent No.: US 7,902,983 B2
(45) Date of Patent: Mar. 8, 2011

(54) RFID TAG

(75) Inventors: Hiroshi Kobayashi, Kawasaki (JP); Kenji Kobae, Kawasaki (JP); Takashi Kubota, Kawasaki (JP); Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 422 days.

(21) Appl. No.: 12/193,364

(22) Filed: Aug. 18, 2008

(65) Prior Publication Data
US 2009/0115577 A1    May 7, 2009

(30) Foreign Application Priority Data

Nov. 7, 2007    (JP) ................... 2007-289394

(51) Int. Cl.
*G08B 13/00* (2006.01)
(52) U.S. Cl. ............... 340/572.1; 340/10.1; 340/10.5
(58) Field of Classification Search ........... 340/572.1, 340/10.1, 10.5, 505
See application file for complete search history.

(56) References Cited

U.S. PATENT DOCUMENTS

| | | | |
|---|---|---|---|
| 7,336,499 B2 | 2/2008 | Hagiwara | |
| 7,619,531 B2 * | 11/2009 | Carrender et al. | 340/572.7 |
| 2005/0093172 A1 | 5/2005 | Tsukahara et al. | |
| 2005/0179122 A1 | 8/2005 | Okawa et al. | |
| 2007/0017986 A1 * | 1/2007 | Carrender et al. | 235/435 |
| 2008/0023217 A1 | 1/2008 | Hagiwara | |
| 2008/0129455 A1 * | 6/2008 | Oberle | 340/10.1 |
| 2009/0108993 A1 * | 4/2009 | Forster | 340/10.1 |
| 2010/0079290 A1 * | 4/2010 | Phaneuf | 340/572.8 |
| 2010/0176971 A1 * | 7/2010 | Banerjee et al. | 340/928 |

FOREIGN PATENT DOCUMENTS

| | | |
|---|---|---|
| EP | 1 243 442 A1 | 9/2002 |
| EP | 1 643 420 A1 | 4/2006 |
| JP | 04-024983 A | 1/1992 |
| JP | 05-041171 U | 6/1993 |
| JP | 2000-114728 A | 4/2000 |
| JP | 2000-311226 A | 11/2000 |
| JP | 2001-351082 A | 12/2001 |
| JP | 2006-196878 A | 7/2006 |
| JP | 2007-108115 A | 4/2007 |
| JP | 2000-200332 A | 7/2008 |

OTHER PUBLICATIONS

European Search Report dated Feb. 27, 2009, issued in corresponding European Patent Application No. 08162934.7.

* cited by examiner

*Primary Examiner* — Travis R Hunnings
(74) *Attorney, Agent, or Firm* — Westerman, Hattori, Daniels & Adrian, LLP

(57) ABSTRACT

An RFID tag includes: a sheet-like base; an antenna provided on the base and extending along the base; a circuit chip mounted on the base and connected to the antenna for performing radio communication through the antenna; a protection body wider than the circuit chip and narrower than the antenna, which is located at least either above the circuit chip or on a backside of the circuit chip with the base interposed therebetween for protecting the circuit chip; and a connection section provided as a portion of the antenna at a location where an edge of the protection body and the antenna intersect with each other as viewed from a direction intersecting with a surface of the base, which includes one or more conductor patterns narrower than other portion of the antenna, and which connects inner and outer antenna portions of the edge with each other.

8 Claims, 2 Drawing Sheets

RFID TAG

BACKGROUND OF THE INVENTION

1. Field of the Invention

The present invention relates to an RFID (Radio Frequency IDentification) tag through which information is exchanged with external equipment in a non-contact manner. The "RFID tag" used in the specification of the present application is called a "radio IC tag" by persons skilled in the technical field of the application in some cases.

2. Description of the Related Art

In recent years, there are proposed various RFID tags through which information is exchanged with external equipment such as a reader/writer in a non-contact manner utilizing radio wave (see Japanese Patent Application Laid-open Nos. 2000-311226, 2000-200332 and 2001-351082, for example). As one kind of such RFID tags, there is proposed an RFID tag in which an antenna pattern, which is a conductor pattern for radio communication, and a circuit chip connected to the antenna pattern are provided on a base sheet made of plastic or paper. Applications for the RFID tag of this type includes the one in which the tag is attached to an article and the article is identified by exchanging information concerning the article with the external equipment.

Among the applications for the RFID tag, there is one in which the tag is attached to an article which is prone to deform such as clothing. In such a using style, since the base is prone to be bent but the circuit chip is less prone to be bent, a bending stress is applied to the circuit chip, and there is a serious problem that the circuit chip is broken or circuit chip is peeled off. Hence, there is conventionally proposed a technique in which the circuit chip is covered with a hard reinforcing body including a peripheral portion of the circuit chip, thereby preventing a deformation of an RFID tag from expanding to the periphery of the circuit chip, and reducing the bending stress applied to the circuit chip.

However, according to the RFID tag using the reinforcing body, although the bending stress applied to the circuit chip is reduced, the bending stress easily concentrates on a periphery of an edge of the reinforcing body. Thus, if the RFID tag is bent many times, the antenna pattern near the reinforcing body is broken and a function as an antenna is deteriorated. Thus, it is desired to enhance the durability of the RFID tag using the reinforcing body against the bending stress.

In view of the above circumstances, the present invention provides an RFID tag having endurance against the bending stress.

SUMMARY OF THE INVENTION

An RFID tag according to the present invention includes:
a sheet-like base;
an antenna provided on the base and extending along the base;
a circuit chip which is mounted on the base and connected to the antenna for carrying out radio communication through the antenna;
a protection body which is wider than the circuit chip and narrower than the antenna, which is located at least either above the circuit chip or on a backside of the circuit chip with the base interposed therebetween, and which protects the circuit chip; and
a connection section which is provided as a portion of the antenna at a location where an edge of the protection body and the antenna intersect with each other as viewed from a direction intersecting with a surface of the base, which comprises one or more conductor patterns narrower than other portion of the antenna, and which connects inner and outer antenna portions of the edge with each other.

According to the RFID tag of the present invention, a connection section provided as a portion of an antenna at a location where the antenna intersects with an edge of a protection body is formed of one or more conductor patterns having a width narrower than other portion of the antenna. Therefore, as compared with a case where a width of an antenna near the edge of the protection body is equal to or greater than a width of other portion of the antenna, the antenna is prone to be bent flexibly and a bending stress applied to the RFID tag does not concentrate on the periphery of the edge of the reinforcing body of the chip and is dispersed. Thus, the RFID tag of the present invention has endurance against the bending stress.

In addition, in the RFID tag according to the present invention, the connection section may have plural conductor patterns which intersect with the edge of the protection body at different positions from each other, or may have conductor patterns intersecting with each other in a form of a mesh.

If an antenna in which an edge portion of the protection body is formed of plural conductor patterns is employed, even if any of the conductor patterns is broken, the remaining conductor patterns which are not broken maintain the function as the antenna, and thus, high endurance is exhibited.

Further, in the RFID tag according to the present invention provided with the connection section having plural conductor patterns or plural conductor patterns intersecting with each other in a form of a mesh, it is preferable that the protection body has a first protection body located above the circuit chip and a second protection body located on a backside of the circuit chip with the base interposed therebetween.

According to such an embodiment, the circuit chip is sufficiently protected against the bending stress applied to the RFID tag.

Further, in the RFID tag according to the present invention provided with the connection section having plural conductor patterns or plural conductor patterns intersecting with each other in a form of a mesh, and the protection body having the first protection body and the second protection body, it is preferable to include a coat covering the base, the antenna, the circuit chip, the protection body and the connection section.

According to such an embodiment, the endurance of the RFID tag against the bending stress applied to the RFID tag is enhanced.

Further, in the RFID tag according to the present invention provided with the connection section having plural conductor patterns or plural conductor patterns intersecting with each other in a form of a mesh, the protection body having the first protection body and the second protection body, and the coat, it is preferable that the protection body has a plate-like shape.

According to such an embodiment, it is possible to easily provide the protection body.

As described above, the RFID tag of the present invention has endurance against a bending stress.

DETAILED DESCRIPTION OF THE INVENTION

Embodiments of the present invention will be explained with reference to the drawings.

Figure 1:
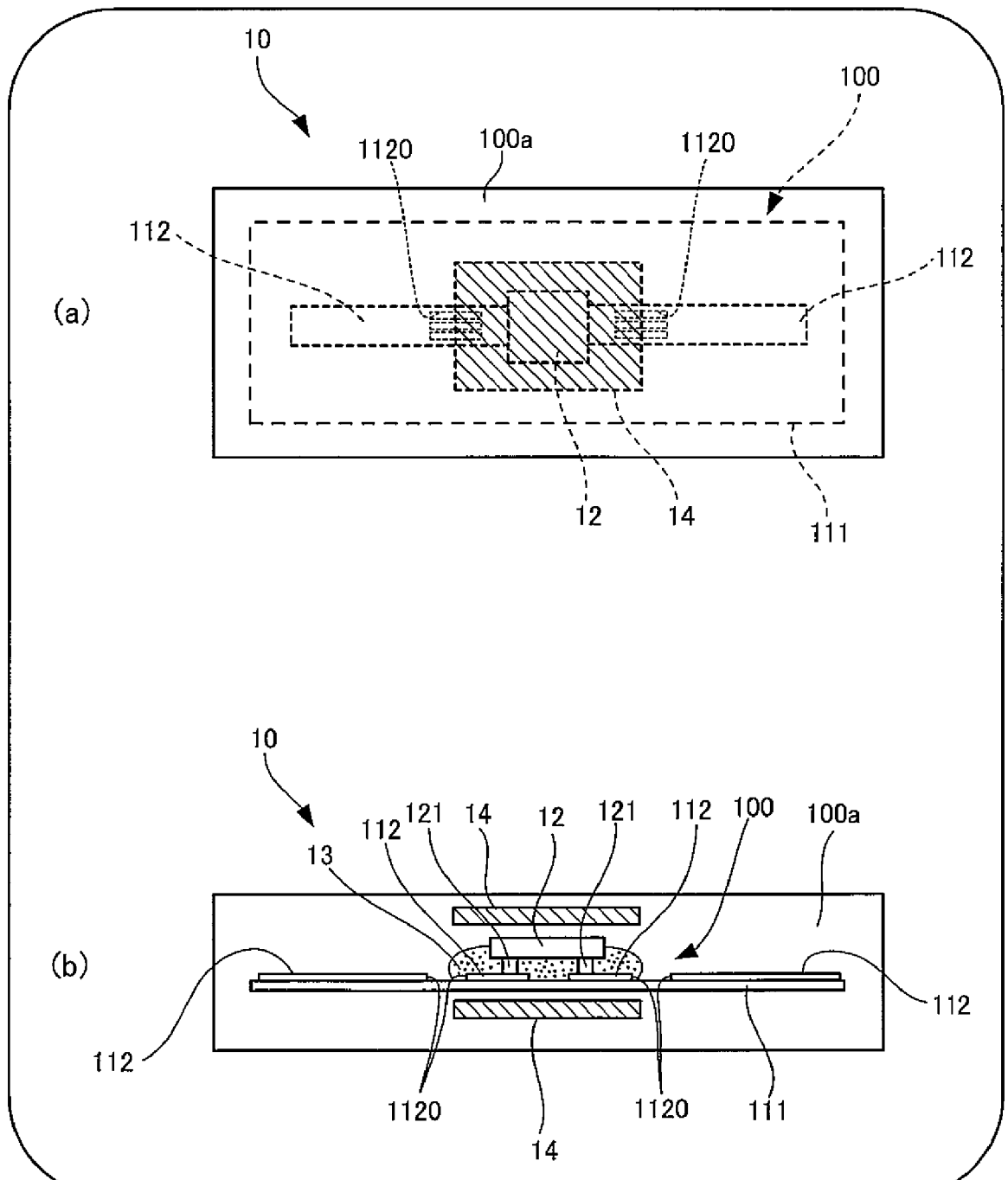
FIG. 1 is a schematic diagram showing one embodiment of an RFID tag of the present invention.

FIG. 1 is a schematic diagram showing one embodiment of an RFID tag of the present invention.

Part (a) of FIG. 1 is a plan view of an RFID tag 10 which is one embodiment of the RFID tag of the present invention in a state where the internal structure thereof is shown in a transparent view, and Part (b) of FIG. 1 is a sectional view of the RFID tag 10 taken along the longitudinal direction thereof.

The RFID tag 10 shown in FIG. 1 is an RFID tag which is formed on the assumption that the RFID tag is attached to an article which is prone to be deformed like clothing and which is worn by a human. The RFID tag 10 is an RFID tag in which an inlay 100 is coated with a rubber coat 100a. The inlay 100 includes a base sheet 111 formed of PET film, an antenna pattern 112 which is provided on the base sheet 111 and which is a conductor pattern constituting a communication antenna, a circuit chip 12 which is electrically connected to the antenna pattern 112 to carry out radio communication through the antenna pattern 112, and two plate-like chip reinforcing bodies 14 made of fiber reinforced resin covering the circuit chip 12 from above and below as shown in Part (b) of FIG. 1. Here, as shown in Part (b) of FIG. 1, bumps 121 of the circuit chip 12 are connected to the antenna pattern 112, which enables electrical connection between the circuit chip 12 and the antenna pattern 112. As shown in Part (b) of FIG. 1, the circuit chip 12 is adhered to the base sheet 111 by an adhesive 13. In Part (a) of FIG. 1, the adhesive 13 is not illustrated. Here, the base sheet 111, the antenna pattern 112, the circuit chip 12, the chip reinforcing bodies 14 and the coat 100a respectively correspond to examples of the base, the antenna, the circuit chip, the protection body and the coat according to the present invention.

According to the RFID tag 10, when the RFID tag 10 is attached to, for example, clothing, a deformation of the clothing is prevented from expanding to the circuit chip 12 itself and peripheries of the circuit chip 12 because the circuit chip 12 is covered with the chip reinforcing bodies 14 formed of hard material, i.e., fiber reinforced resin as shown in Part (b) of FIG. 1. With this, the circuit chip 12 itself and the adhering portion between the circuit chip 12 and the base sheet 111 are prevented from being damaged.

Generally, in the RFID tag having a chip reinforcing body, since the chip reinforcing body exists, the circuit chip itself and the peripheries of the circuit chip covered with the chip reinforcing body are protected against the bending stress applied to the RFID tag from outside, but instead of this, the bending stress is prone to concentrate on the peripheries of an edge of the chip reinforcing body, and if the RFID tag is bent many times, the antenna pattern near the edge of the chip reinforcing body is broken, and there is a possibility that the function as an antenna is deteriorated.

Hence, in the RFID tag 10 shown in FIG. 1, as shown in Part (a) of FIG. 1, the antenna pattern near the edge of the chip reinforcing body 14 is provided with plural notches 1120 extending in the longitudinal direction of the RFID tag 10. Since the notches 1120 exist, the antenna patterns 112 near the edge of the chip reinforcing bodies 14 are formed of plural separated linear conductor patterns. If the plural linear conductor patterns are employed as antenna patterns near the edge of the chip reinforcing body 14, the antenna pattern 112 is flexible and easily bent, and a bending stress applied to the RFID tag 10 does not concentrate on the periphery of the edge of the chip reinforcing body 14 and is dispersed, as compared with an antenna pattern having no notches 1120 in which the entire antenna pattern including the edge area of the chip reinforcing body 14 is formed of band-like conductor patterns. If the plural linear conductor patterns are employed as antenna patterns near the edge of the chip reinforcing body 14 in the RFID tag 10, even if any of the plural linear conductor patterns is broken, since the remaining conductor patterns which are not broken maintain the function as communication antenna, the RFID tag 10 has endurance against the bending stress.

Next, another embodiment of the RFID tag of the present invention will be explained.

Figure 2:
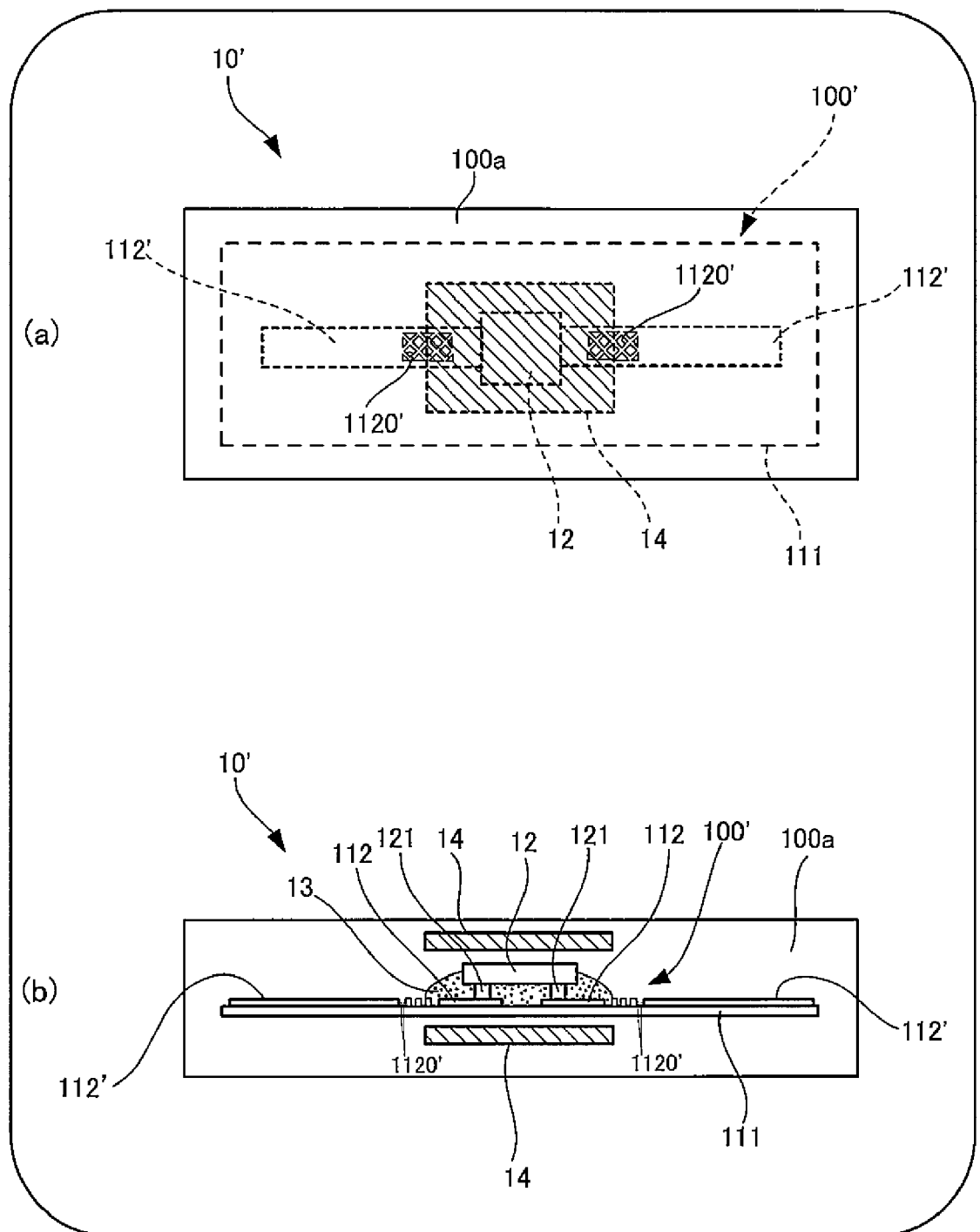
FIG. 2 is a schematic diagram showing another embodiment of the RFID tag of the present invention.

FIG. 2 is a schematic diagram showing another embodiment of the RFID tag of the present invention.

Part (a) of FIG. 2 is a plan view of an RFID tag 10' which is another embodiment of the RFID tag of the present invention in a state where the internal structure thereof is shown in a transparent view, and Part (b) of FIG. 2 is a sectional view of the RFID tag 10' taken along the longitudinal direction thereof.

The RFID tag 10' shown in FIG. 2 is also an RFID tag which is formed on the assumption that the RFID tag is attached to an article which is prone to be deformed like clothing and which is worn by a human. The same constituent elements as those shown in FIG. 1 are designated with the same reference symbols, and the explanation thereof will not be repeated.

The RFID tag 10' shown in FIG. 2 is different from the RFID tag 10 shown in FIG. 1 in that, in the antenna pattern 112' of the inlay 100' shown in FIG. 2, the conductor patterns near the edge of the chip reinforcing bodies 14 are not plural linear conductor patterns shown in Part (a) of FIG. 1, but are mesh-like conductor patterns. More specifically, according to the RFID tag 10' shown in FIG. 2, in the antenna patterns 112' near the edges of the chip reinforcing bodies 14, triangular or rectangular notches 1120' which are regularly arranged at equal distances from one another are provided as shown in Part (a) of FIG. 2 instead of the plural notches 1120 in FIG. 1. Since the notches 1120' exist, the antenna patterns 112' near the edges of the chip reinforcing bodies 14 are mesh-like conductor patterns. As compared with a case in which the entire antenna patterns are conductor patterns, the RFID tag 10' in FIG. 2 is also prone to be bent flexibly, and a bending stress applied to the RFID tag 10' in FIG. 2 does not concentrate on the periphery of the edge of the chip reinforcing body and is dispersed. If the mesh-like conductor patterns are employed as the antenna patterns near the edges of the chip reinforcing bodies 14 in the RFID tag 10' in FIG. 2, even if any of mesh-like conductor patterns is broken, remaining conductor patterns which are not broken can maintain the function as a communication antenna, and thus, the RFID tag 10' also has endurance against the bending stress.

The above is the explanation of the embodiments of the present invention.

Although the chip reinforcing bodies 14 are two plate-like chip reinforcing bodies 14 covering the circuit chip 12 respectively from above and below in the above explanation, the number of the chip reinforcing body 14 may be one and the chip reinforcing body may cover the circuit chip 12 from one of above and below. Alternatively, a cap-like chip reinforcing body covering an upper portion or a lower portion of the circuit chip 12 and also covering a side of the circuit chip 12 may be employed.

Although the chip reinforcing body 14 is surrounded by the coat 100a and fixed in the above explanation, the chip reinforcing body may be fixed directly to the base sheet by resin, or the like.

What is claimed is:

1. An RFID tag comprising
   a sheet-like base,
   an antenna provided on the base and extending along the base, a circuit chip which is mounted on the base and connected to the antenna for carrying out radio communication through the antenna, a protection body which is wider than the circuit chip and narrower than the antenna, which is located at least either above the circuit chip or on a backside of the circuit chip with the base interposed therebetween, and which protects the circuit chip, and a connection section which is provided as a portion of the antenna at a location where an edge of the protection body and the antenna intersect with each other as viewed from a direction intersecting with a surface of the base, which comprises one or more conductor patterns narrower than other portion of the antenna, and which connects inner and outer antenna portions of the edge with each other.

2. The RFID tag according to claim 1, wherein the connection section comprises a plurality of conductor patterns which intersect with the edge of the protection body at different positions from each other.

3. The RFID tag according to claim 1, wherein the connection section comprises a plurality of conductor patterns intersecting with each other in a form of a mesh.

4. The RFID tag according to claim 1, wherein the protection body comprises a first protection body located above the circuit chip and a second protection body located on a backside of the circuit chip with the base interposed therebetween.

5. The RFID tag according to claim 2, wherein the protection body comprises a first protection body located above the circuit chip and a second protection body located on a backside of the circuit chip with the base interposed therebetween.

6. The RFID tag according to claim 3, wherein the protection body comprises a first protection body located above the circuit chip and a second protection body located on a backside of the circuit chip with the base interposed therebetween.

7. The RFID tag according to claim 1, further comprising a coat covering the base, the antenna, the circuit chip, the protection body and the connection section.

8. The RFID tag according to claim 1, wherein the protection body has a plate-like shape.

* * * * *